US008728845B2

(12) United States Patent
Lin et al.

(10) Patent No.: US 8,728,845 B2
(45) Date of Patent: May 20, 2014

(54) METHOD AND APPARATUS FOR SELECTIVELY REMOVING ANTI-STICTION COATING

(75) Inventors: Shih-Wei Lin, Taipei (TW); Ping-Yin Liu, Yonghe (TW); Lan-Lin Chao, Sindian (TW); Jung-Huei Peng, Jhubei (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 174 days.

(21) Appl. No.: 13/071,334

(22) Filed: Mar. 24, 2011

(65) Prior Publication Data

US 2012/0244677 A1    Sep. 27, 2012

(51) Int. Cl.
*H01L 21/56* (2006.01)

(52) U.S. Cl.
USPC .............. 438/51; 438/55; 438/108; 438/127; 438/759; 257/E21.503; 257/E21.254; 427/558

(58) Field of Classification Search
USPC .......................... 438/51, 55, 108, 127, 759; 257/E21.503, E21.254; 427/558
See application file for complete search history.

(56) References Cited

U.S. PATENT DOCUMENTS

| 7,208,191 | B2 * | 4/2007 | Freedman ...................... 427/58 |
| 7,282,254 | B1 * | 10/2007 | Cho et al. .................... 428/195.1 |
| 7,285,514 | B2 | 10/2007 | Kang et al. |
| 2006/0220223 | A1 | 10/2006 | Lu et al. |
| 2006/0292846 | A1 * | 12/2006 | Pinto et al. ..................... 438/597 |
| 2007/0048887 | A1 | 3/2007 | Erlach et al. |
| 2007/0281492 | A1 * | 12/2007 | Chinn et al. .................. 438/725 |
| 2008/0230110 | A1 * | 9/2008 | Freedman ..................... 136/246 |

* cited by examiner

*Primary Examiner* — George Fourson, III
(74) *Attorney, Agent, or Firm* — Haynes and Boone, LLP

(57) ABSTRACT

The present disclosure provides various methods for removing an anti-stiction layer. An exemplary method includes forming an anti-stiction layer over a substrate, including over a first substrate region of a first material and a second substrate region of a second material, wherein the second material is different than the first material; and selectively removing the anti-stiction layer from the second substrate region of the second material without using a mask.

21 Claims, 8 Drawing Sheets

METHOD AND APPARATUS FOR SELECTIVELY REMOVING ANTI-STICTION COATING

This application is related to U.S. patent application Ser. No. 12/964,347, filed Dec. 9, 2011, entitled "Self-Removal Anti-Stiction Coating for Bonding Process," the entire disclosure of which is incorporated herein by reference.

BACKGROUND

Microelectromechanical systems (MEMS) devices are very small electro-mechanical systems incorporated into integrated circuit devices. Because MEMS devices typically have large surface area to volume ratios, they are susceptible to adhesion (stiction). Anti-stiction layers, such as self-assembled monolayers (SAMs), have thus been implemented to coat the MEMS devices. Though anti-stiction layers effectively prevent stiction, these layers present issues during packaging, particularly when using wafer level packaging (WLP) technology (which provides for packaging integrated circuit devices at wafer level). More specifically, anti-stiction layers prevent effective bonding during the packaging process. To address this issue, conventional approaches use an ultraviolet (UV) treatment (such as a UV ozone treatment) to remove the anti-stiction layer from bonding areas of the device. The UV treatment requires using a mask to "shadow" the non-bonding areas of the device to ensure that the anti-stiction layer remains on the non-bonding areas, yet is removed from the bonding areas. This typically requires extra processing time and costs. Accordingly, although existing approaches for removing anti-stiction layers from bonding areas of MEMS devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
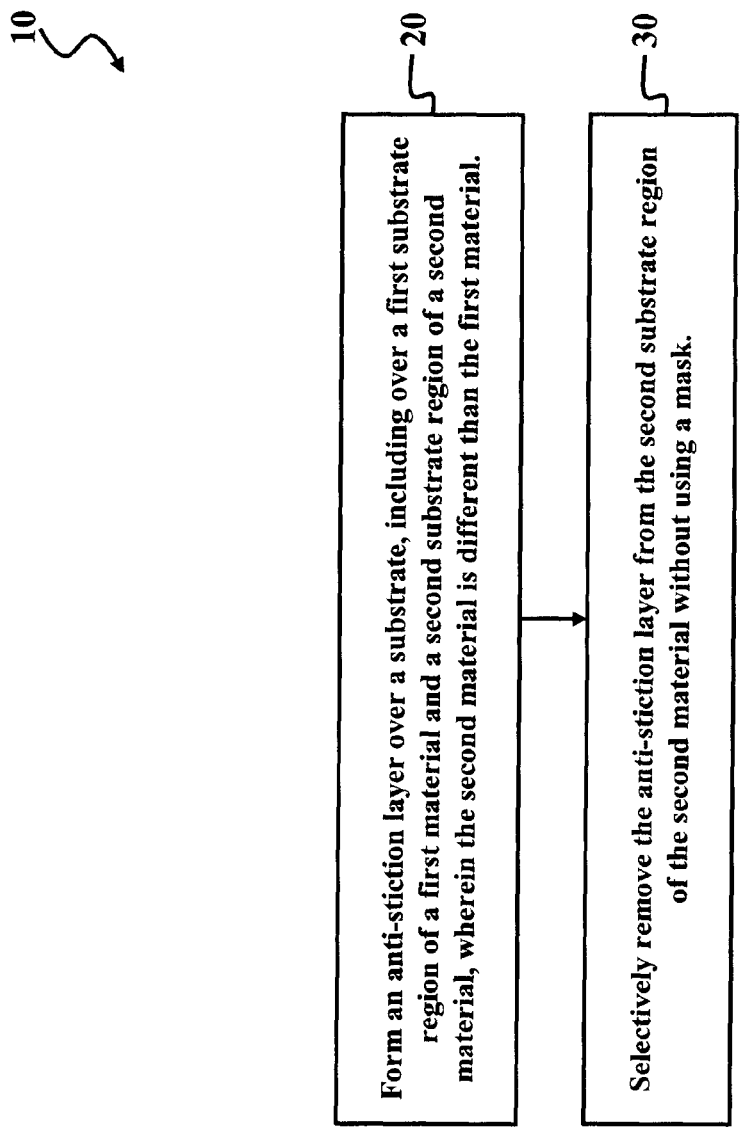
FIG. 1 is a flow chart of a method for selectively removing an anti-stiction layer according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, descriptions of a first feature "on" or "over" a second feature (and like descriptions) may include embodiments where the first and second features are in direct contact, and may also include embodiments where additional features are interposed between the first and second features. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flow chart of a method 10 for removing an anti-stiction layer according to various aspects of the present disclosure. The method 10 begins at block 20 by forming an anti-stiction layer over a substrate. The substrate includes a first substrate region of a first material and a second substrate region of a second material. The anti-stiction layer is thus formed over the first substrate region of the first material and the second substrate region of the second material. The second material is different than the first material. In an example, the first material is a silicon-based material, such as silicon, polysilicon, silicon oxide, silicon nitride, other silicon-based material, or combinations thereof. In an example, the second material is a metal-based material, such as Al (aluminum), Ge (germanium), Ti (titanium), Cu (copper), W (tungsten), In (indium), Au (gold), Sn (tin), other metal-based material, alloys thereof (such as AlCu, TiN, AlGe, or AuSn), or combinations thereof. At block 30, the anti-stiction layer is selectively removed from the second substrate region of the second material. Selectively removing the anti-stiction layer is achieved without using a mask. For example, a thermal treatment is applied to the anti-stiction layer to selectively remove the anti-stiction layer from the second substrate region of the second material. The thermal treatment uses a thermal treatment process parameter, such as a thermal treatment temperature and/or a thermal treatment time, that removes the anti-stiction layer from the second substrate region of the second material, yet preserves the anti-stiction layer over the first substrate region of the first material. In another example, an excimer laser or a charged particle beam, such as an electron beam, may selectively remove the anti-stiction layer from the second substrate region of the second material. Additional steps can be provided before, during, and after the method 10, and some of the steps described can be replaced or eliminated for other embodiments of the method 10. The discussion that follows illustrates various embodiments of removing an anti-stiction layer that can be achieved according to the method 10 of FIG. 1.

Figure 2:
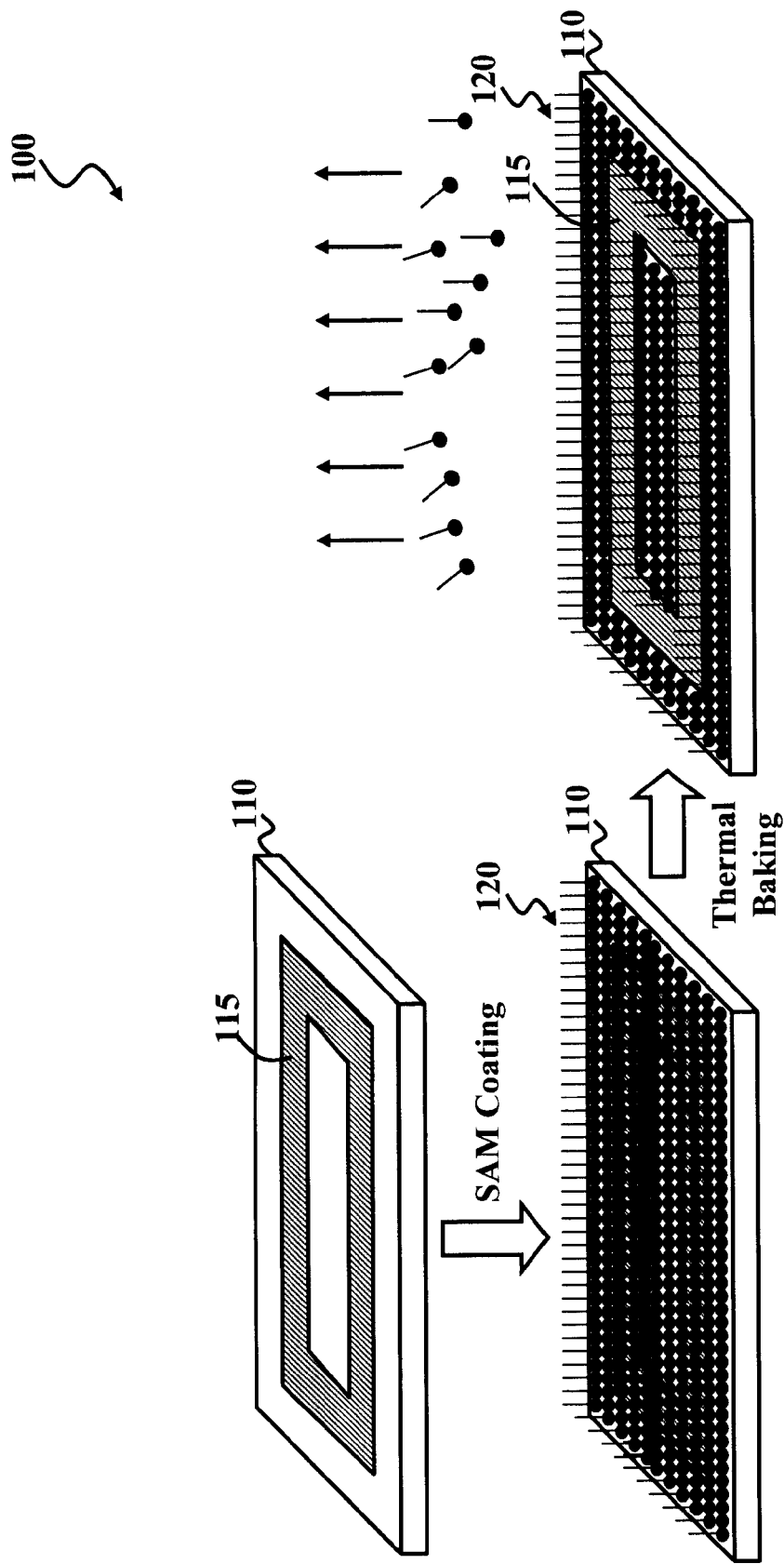
FIG. 2 is a perspective view of a material layer during various stages of the method of FIG. 1 according to various aspects of the present disclosure.

FIG. 2 is a perspective view of a material layer 100, in portion or entirety, at various stages of the method 10 of FIG. 1. FIG. 2 has been simplified for the sake of clarity to better understand the inventive concepts of the present disclosure. Additional features can be added in the material layer 100, and some of the features described below can be replaced or eliminated for additional embodiments of the material layer 100.

The material layer 100 includes a material portion 110 and a material portion 115. The material portion 110 includes a material different than the material portion 115. In the depicted embodiment, the material portion 110 includes a silicon-based material, and the material portion 115 includes a metal-based material. Exemplary silicon-based materials include silicon, polysilicon, silicon oxide, silicon nitride, other silicon-based material, or combinations thereof. Exemplary metal-based materials include Al (aluminum), Ge (germanium), Ti (titanium), Cu (copper), W (tungsten), In (indium), Au (gold), Sn (tin), other metal-based material, alloys thereof (such as AlCu, TiN, AlGe, or AuSn), or combinations thereof. In an example, the material portion 110 is a silicon substrate, and the material portion 115 is a metal feature disposed in the silicon substrate.

An anti-stiction layer 120 coats the material portion 110 and the material portion 115. The anti-stiction layer 120 is an organic-based material. In the depicted embodiment, the anti-stiction layer 120 includes one or more self-assembled monolayers (SAMs). The SAMs layer may include silane molecules and alky-chains, or fluorinated alky-chains. For example, the SAMs layer may include FOST ($C_8H_4Cl_3F_{13}Si$), FOMDS ($C_9H_7Cl_2F_{13}Si$), FOMMS ($C_{10}H_{10}ClF_{13}Si$), FOTES ($C_{14}H_{19}F_{13}O_3Si$), FDTS ($C_{10}H_4F_{19}Cl_3Si$), OTS ($C_{18}H_{37}Cl_3Si$), other suitable material, or combinations thereof. Alternatively, the anti-stiction layer 120 includes another suitable material. The anti-stiction layer 120 is formed by a molecular vapor deposition (MVD) process or other suitable process.

The anti-stiction layer 120 interacts differently with the material portion 110 and the material portion 115. In the depicted embodiment, since the material portion 110 includes the silicon-based material, the anti-stiction layer 120 interacts with the material portion 110 to form Si—Si bonds between the anti-stiction layer 120 and the material portion 110. In an example, when the anti-stiction layer 120 includes silane molecules, hydroxylation of the silane molecules can produce hydroxylized silanes that attach to the silicon-based material portion 110. For example, covalent bonds may form between the anti-stiction layer 120 and the material portion 110 when the hydroxylized silanes attach to OH groups of the silicon-based material portion 110. Such attachment can generate an anti-stiction layer that is a thin Teflon-like film, which can exhibit low surface energy. Further, in the depicted embodiment, since the material portion 115 includes the metal-based material, the anti-stiction layer 120 reacts with the material portion 115 to form Si-metal bonds. In an example, the anti-stiction layer 120 physically adsorbs on the material portion 115. The anti-stiction layer 120 also includes molecules that can bind (crosslink) with one another to form an extended network of anti-stiction layer molecules, thereby providing a cohesive anti-stiction layer 120 over the material portion 110 and the material portion 115.

In the depicted embodiment, a thermal treatment, such as a thermal baking process, is applied to the anti-stiction layer 120. Applying the thermal treatment to the anti-stiction layer 120 breaks down bonds between the anti-stiction layer 120 and the material portion 115 faster than bonds between the anti-stiction layer 120 and the material portion 110. This occurs because the Si—Si bonds between the anti-stiction layer 120 and material portion 110 are stronger than the Si-metal bonds between the anti-stiction layer 120 and the material portion 115. Put another way, a bonding energy between the anti-stiction layer 120 and the material portion 110 is greater than a bonding energy between the anti-stiction layer 120 and the material portion 115. Because of the different bonds between the anti-stiction layer 120 and the material portions 110 and 115, a thermal treatment process parameter for the thermal treatment may be used that selectively removes the anti-stiction layer 120 from the material portion 115, while preserving the ant-stiction layer 120 over the material portion 110. For example, if a temperature of the thermal treatment is too high, and/or a time of the thermal treatment is too long, the Si—Si bonds between the anti-stiction layer 120 and the material portion 110 may break down along with the Si-metal bonds between the anti-stiction layer 120 and the material portion 115. Then, the thermal treatment may remove the anti-stiction layer 120 from both the material portion 110 and the material portion 115. On the other hand, if the temperature of the thermal treatment is too low, and/or the time of the thermal treatment is too short, the Si-metal bonds between the anti-stiction layer 120 and the material portion 115 may not sufficiently break down, and thus the anti-stiction layer 120 will not be sufficiently removed from the material portion 115.

Accordingly, in the depicted embodiment, the thermal treatment uses a thermal treatment process parameter, such as a thermal treatment temperature and/or a thermal treatment time, to selectively remove the anti-stiction layer 120 from the material portion 115. Using the appropriate thermal treatment process parameter substantially breaks down the Si-metal bonds between the anti-stiction layer 120 and the material portion 115, while preserving the Si—Si bonds between the anti-stiction layer 120 and the material portion 110. The anti-stiction layer 120 over the material portion 115 may turn into a gas, thereby leaving the material portion 115 free of the anti-stiction layer 120. In an example, a thermal treatment temperature is about 100° C. to about 500° C. In an example, a thermal treatment time is about ten minutes to about three hours. Other thermal treatment temperatures, thermal treatment times, and thermal treatment parameters are contemplated depending on compositions of the material portion 110, the material portion 115, and the anti-stiction layer 120.

FIGS. 3-6 are diagrammatic cross-sectional views of a device 200, in portion or entirety, at various stages of the method 10 of FIG. 1. In the depicted embodiment, FIGS. 3-6 illustrate wafer level packaging (WLP) technology according to the method 10, which is not intended to be limiting. Other packaging technologies may utilize the method 10 and features described herein. FIGS. 3-6 have been simplified for the sake of clarity to better understand the inventive concepts of the present disclosure. Additional features can be added in the device 200, and some of the features described below can be replaced or eliminated for additional embodiments of the device 200.

Figure 3:
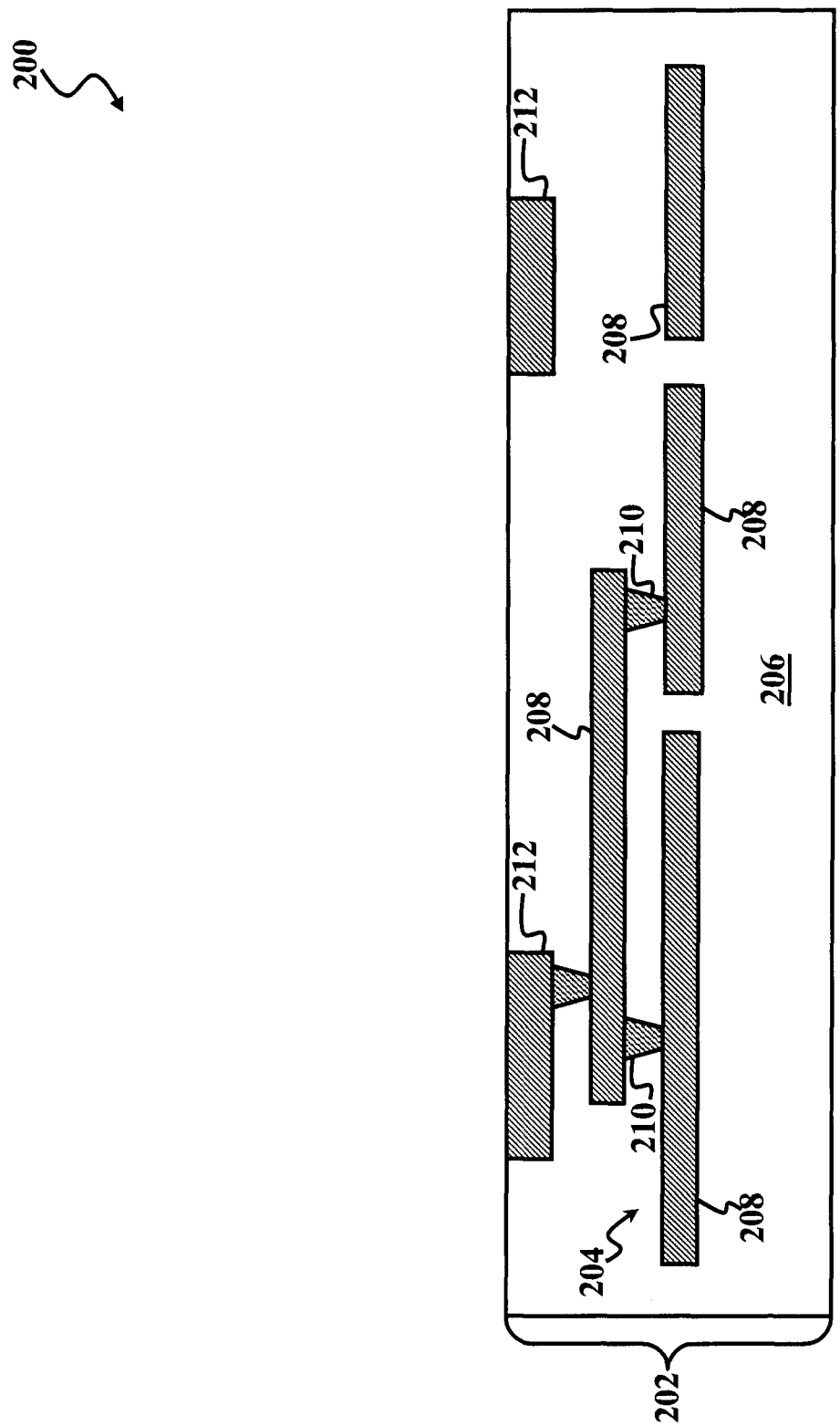
FIGS. 3-6 are diagrammatic cross-sectional views of a device during various stages of the method of FIG. 1 according to various aspects of the present disclosure.

In FIG. 3, a substrate 202 of the integrated circuit device 200 is provided. The substrate 202 includes various layers that are not separately depicted and that can combine to form various microelectronic elements that may include: transistors (for example, metal-oxide-semiconductor field effect transistors (MOSFET) including complementary metal-oxide-semiconductor (CMOS) transistors, bipolar junction transistors (BJT), high voltage transistors, high frequency transistors, p-channel and/or n-channel field effect transistors (PFETs/NFETs)); resistors; diodes; capacitors; inductors; fuses; and/or other suitable elements. The various layers may include high-k dielectric layers, gate layers, hard mask layers, interfacial layers, capping layers, diffusion/barrier layers, dielectric layers, conductive layers, other suitable layers, or combinations thereof. The microelectronic elements could be interconnected to one another to form a portion of the integrated circuit device 200, such as a logic device, memory device (for example, a static random access memory (SRAM)), radio frequency (RF) device, input/output (I/O) device, system-on-chip (SoC) device, other suitable types of devices, or combinations thereof. In the depicted embodiment, the substrate 202 includes an integrated circuit device (or portion thereof) designed and formed by CMOS based processes. The substrate 202 is thus referred to as a CMOS substrate. A substrate including a device formed using other integrated circuit fabrication technologies is also within the scope of the present disclosure.

The CMOS substrate 202 includes a multilayer interconnect (MLI) structure 204 formed in an insulating layer 206 (for example, one or more interlayer dielectric (ILD) layers) of the substrate 202. The insulating layer 206 includes a dielectric material, such as silicon oxide, silicon nitride, silicon oxynitride, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, parylene, BCB (bis-benzocyclobutenes), SiLK (Dow Chemical, Midland, Mich.), polyimide, other dielectric material, or combinations thereof. The MLI structure 204 includes various horizontal conductive features 208, such as metal lines, and vertical conductive features 210, such as contacts and vias. A contact is configured to connect metal lines with the substrate, and a via is configured to connect metal lines. The various features of the MLI structure 204 may include various conductive materials including aluminum, copper, tungsten, and/or silicide. In an example, a damascene and/or dual damascene process forms a copper related MLI structure. In another example, a damascene and/or dual damascene process forms an aluminum related MLI structure.

The CMOS substrate 202 also includes a bonding layer 212. In the depicted embodiment, the bonding layer 212 is the topmost metal layer of the MLI structure 204. Alternatively, the bonding layer 212 could be a layer separate and apart from the MLI structure 204. The bonding layer 212 includes a conductive material, such as Al, Ti, W, Cu, Ge, In, Au, Sn, other conductive material, alloys thereof, or combinations thereof. The bonding layer 212 may include a multilayer structure.

Figure 4:
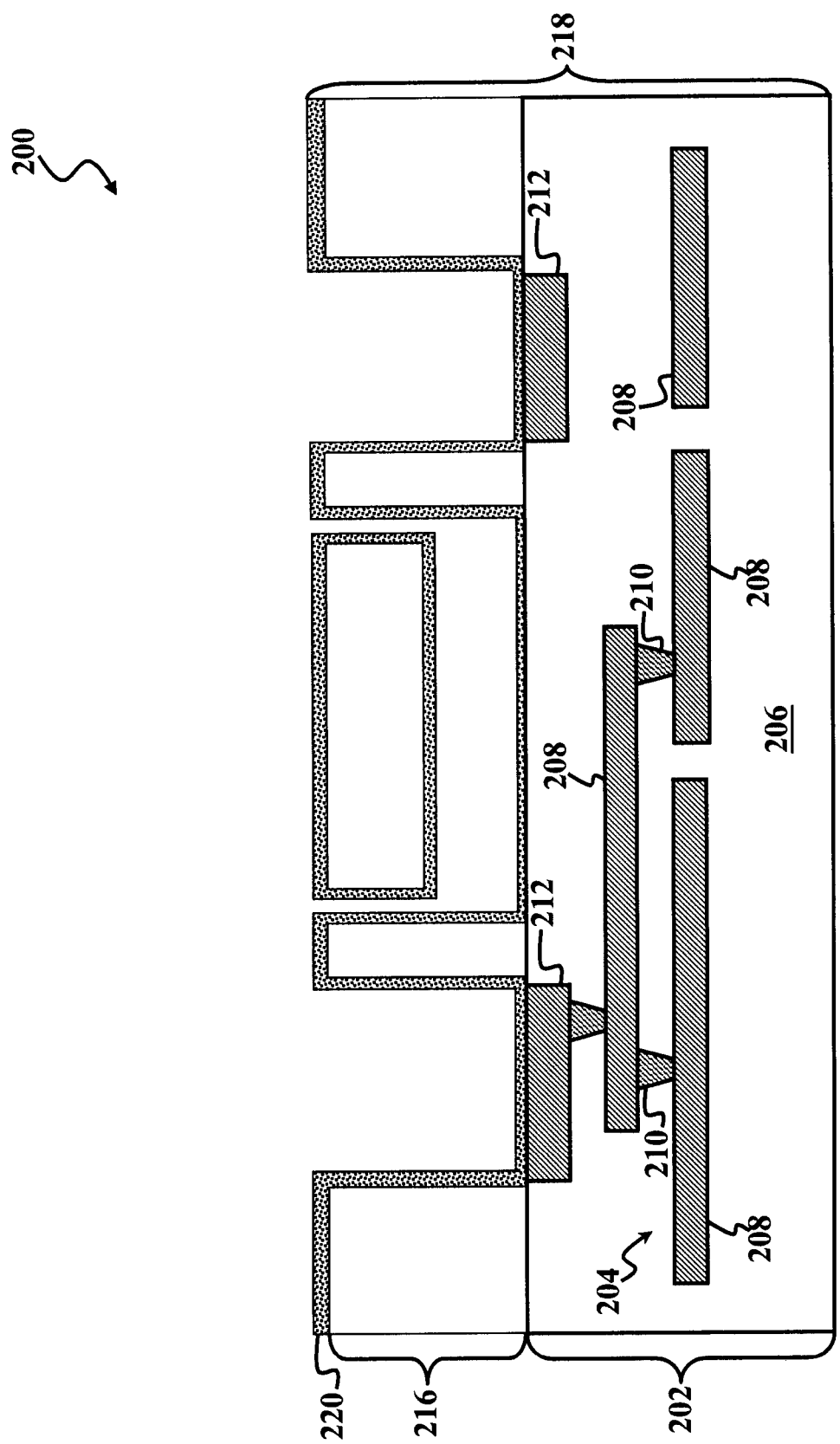

In FIG. 4, a substrate 216 is bonded to (coupled with) the substrate 202, collectively forming a device substrate 218. In the depicted embodiment, the substrate 216 is a semiconductor substrate including silicon. Alternatively, the substrate 216 is a semiconductor on insulator (SOI) or other suitable semiconductor substrate. The substrate 216 includes a device designed to interface with the substrate 202. For example, in the depicted embodiment, the substrate 216 includes a microelectromechanical system (MEMS) device. Accordingly, the substrate 216 is referred to as a MEMS substrate. The MEMS device is a MEMS device of a known type, such as a motion sensor (for example, a gyroscope or an accelerometer). Alternatively, the MEMS device could be a RF MEMS device (for example, an RF switch or filter), an oscillator, a MEMS microphone, and/or any other MEMS type device, including future MEMS type devices. One of ordinary skill in the art will recognize that the MEMS device could alternatively include nanoelectromechanical elements, for example, the MEMS device could alternatively be a nanoelectromechanical system (NEMS) device. The substrate 216 may also include microelectronic elements, such as those described above with reference to substrate 202. Where the substrate 216 includes various microelectronic elements, the MEMS device could be interconnected to the microelectronic elements. The MEMS device may be interconnected with the various microelectronic elements of the substrate 202.

An anti-stiction layer 220 is disposed over the substrate 216. The anti-stiction layer 220 coats the MEMS device of the substrate 216, which is formed of a silicon-based material in the depicted embodiment. Further, the anti-stiction layer 220 is disposed over the bonding layer 212 (a bonding region of the device substrate 218) and a portion of the insulating layer 206, which includes silicon oxide in the depicted embodiment. The anti-stiction layer 220 is an organic based material. In the depicted embodiment, the anti-stiction layer 220 includes one or more self-assembled monolayers (SAMs). The SAMs layer may include silane molecules and alky-chains, or fluorinated alky-chains. For example, the SAMs layer may include FOST ($C_8H_4Cl_3F_{13}Si$), FOMDS ($C_9H_7Cl_2F_{13}Si$), FOMMS ($C_{10}H_{10}ClF_{13}Si$), FOTES ($C_{14}H_{19}F_{13}O_3Si$), FDTS ($C_{10}H_4F_{19}Cl_3Si$), OTS ($C_{18}H_{37}Cl_3Si$), other suitable material, or combinations thereof. Alternatively, the anti-stiction layer 220 includes another suitable material. In the depicted embodiment, the anti-stiction layer 220 is formed by a molecular vapor deposition (MVD) process or other suitable process.

The anti-stiction layer 220 interacts differently with the bonding layer 212, substrate 216, and insulator layer 206. In the depicted embodiment, since the substrate 216 and insulator layer 206 include silicon-based material (such as silicon and silicon oxide, respsectively), the anti-stiction layer 220 interacts with the substrate 216 and insulator layer 206 to form Si—Si bonds between the anti-stiction layer 220 and the substrate 216 and insulator layer 206. In an example, when the anti-stiction layer 220 includes silane molecules, hydroxylation of the silane molecules can produce hydroxylized silanes that attach to the silicon-based materials of the device substrate 218. For example, covalent bonds may form between the anti-stiction layer 220 and the substrate 216 and insulator layer 206 when the hydroxylized silanes attach to OH groups of the silicon-based materials of the device substrate 218. Such attachment can generate an anti-stiction layer that is a thin Teflon-like film, which can exhibit low surface energy. Further, in the depicted embodiment, since the bonding layer 212 is a metal-based material, the anti-stiction layer 220 interacts with the bonding layer 212 to form Si-metal bonds. In an example, the anti-stiction layer 220 physically adsorbs on the bonding layer 212. The anti-stiction layer 220 also includes molecules that can bind (crosslink) with one another to form an extended network of anti-stiction layer molecules, thereby providing a cohesive anti-stiction layer 220 over the bonding layer 212, substrate 216, and insulator layer 216.

Figure 5:
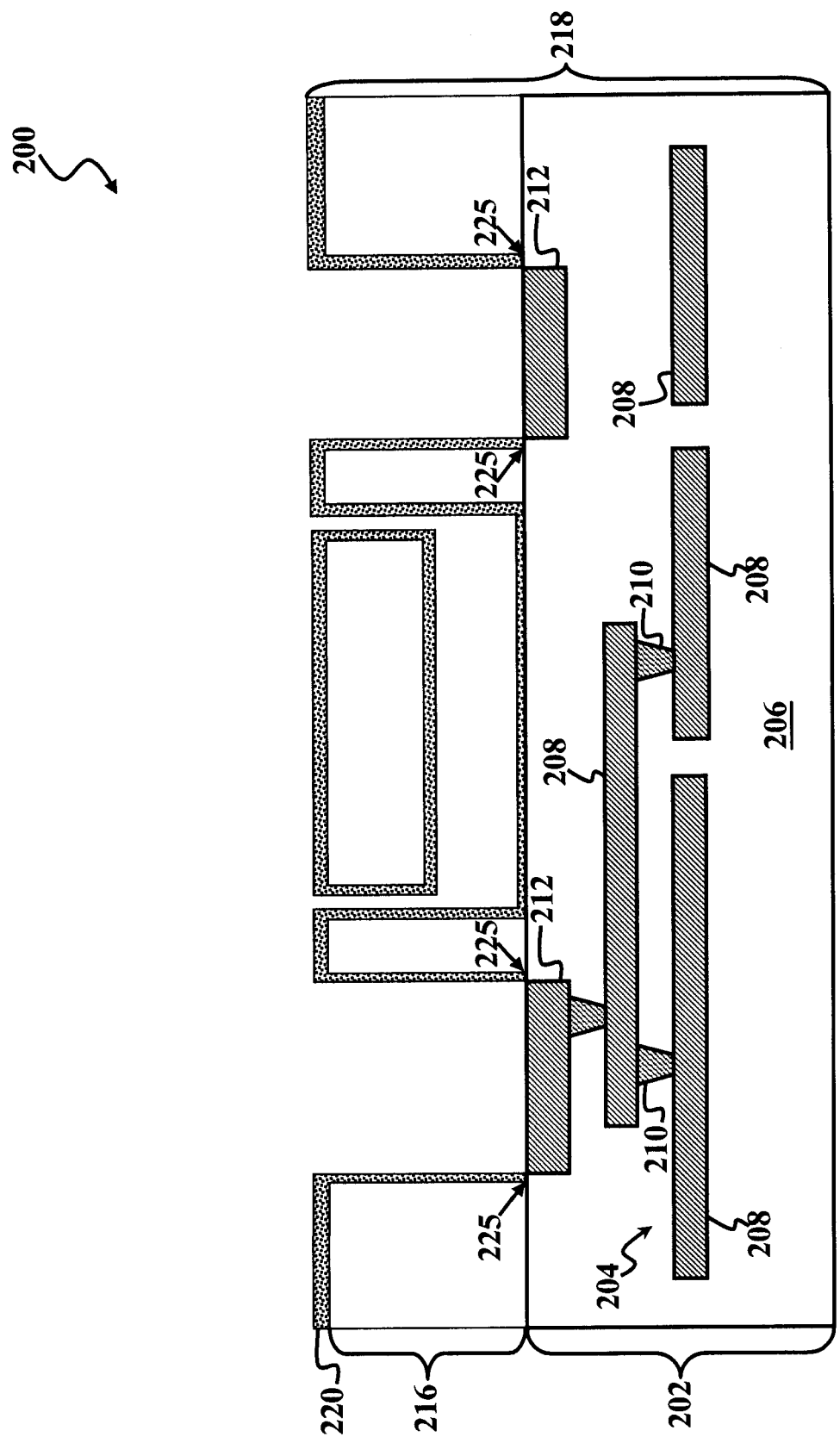

In FIG. 5, a thermal treatment, such as a thermal baking process, is applied to the anti-stiction layer 220. The thermal treatment may be performed in a furnace, an oven, a chemical vapor deposition (CVD) chamber, or any other heating apparatus. In an example, the anti-stiction layer 220 is formed and selectively removed in a same processing chamber. Applying the thermal treatment to the anti-stiction layer 220 breaks down bonds between the anti-stiction layer 220 and the bonding layer 212 faster than bonds between the anti-stiction layer 220 and the silicon-based material portions of the device substrate (substrate 216 and insulator layer 206). This occurs because the Si—Si bonds between the anti-stiction layer 220 and substrate 216 and insulator layer 206 are stronger than the Si-metal bonds between the anti-stiction layer 220 and the bonding layer 212. Put another way, a bonding energy between the anti-stiction layer 220 and the substrate 216 and insulator 206 is greater than a bonding energy between the anti-stiction layer 220 and the bonding layer 212. Taking advantage of the different bonding strengths and/or energies between the anti-stiction layer 220 and various material portions of the device substrate 218, the thermal treatment uses a thermal treatment process parameter, such as a thermal treatment temperature and/or a thermal treatment time, to selectively remove the anti-stiction layer 220 from the bonding layer 212 (in the depicted embodiment, metal-based portion of the device substrate 218), while preserving the anti-stiction layer 220 over the MEMS substrate 216 and portions 225 of the insulator layer 206 (in the depicted embodiment, silicon-based portions of the device substrate 218). More specifically, in the depicted embodiment, using an appropriate thermal treatment process parameter substantially breaks down Si-metal bonds between the anti-stiction layer 220 and the bonding layer 212, while preserving Si—Si bonds between the anti-stiction layer 220 and MEMS substrate 216, and Si—Si bonds between the anti-stiction layer 220 and portions 225 of the insulator layer 216. The anti-stiction layer 220 over the bonding layer 212 may turn into a gas, thereby leaving the bonding layer 212 free of the anti-stiction layer 220. In an example, a thermal treatment temperature is about 100° C. to about 500° C. In an example, a thermal treatment time is about ten minutes to about three hours. Other thermal treatment temperatures, thermal treatment times, and thermal treatment parameters are contemplated depending on compositions of the bonding layer 212, MEMS substrate 216, portions of the insulator layer 216, and/or the anti-stiction layer 220.

Figure 6:
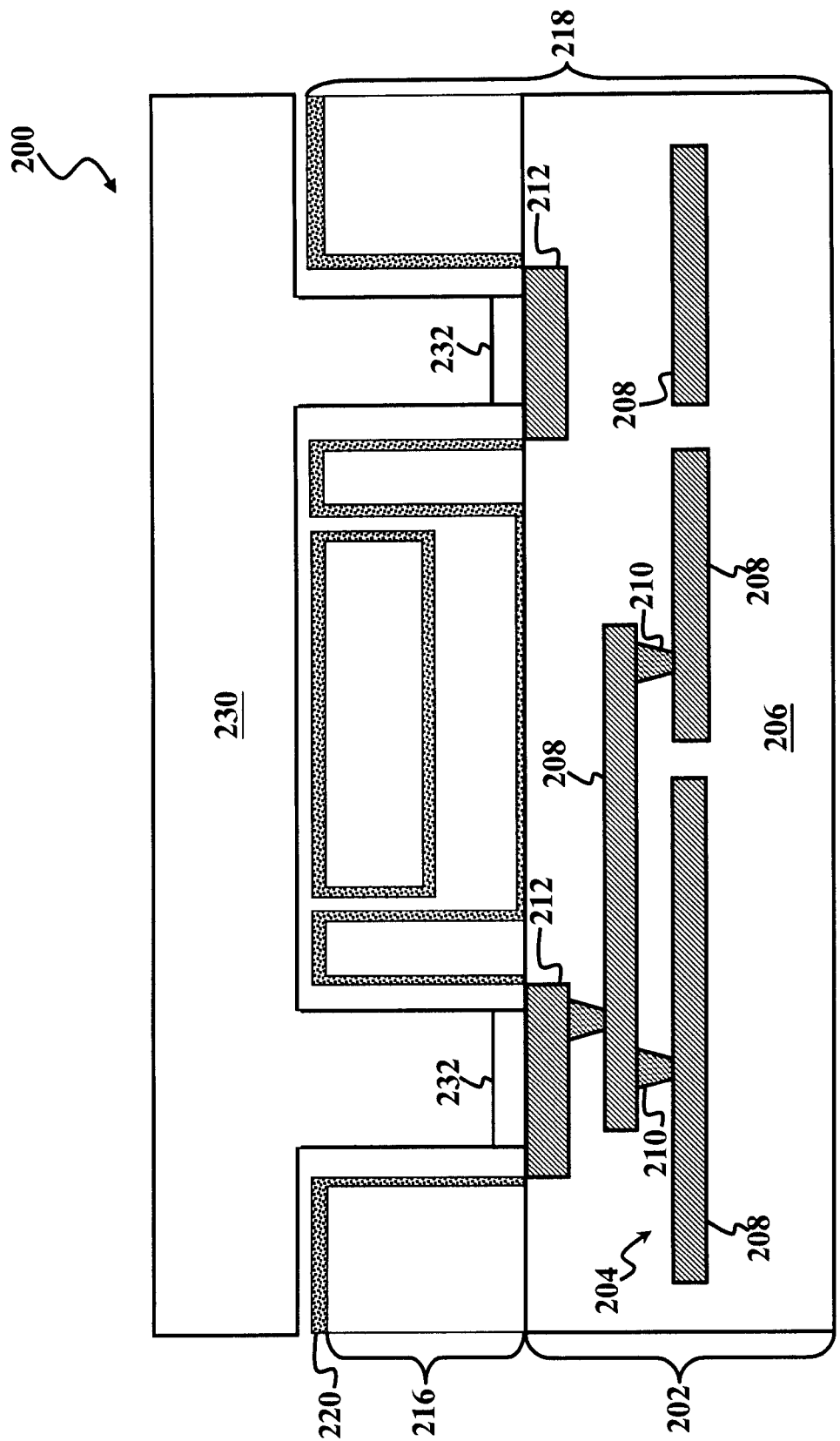

In FIG. 6, a substrate 230 is bonded to the device substrate 218. In the depicted embodiment, the substrate 230 is referred to as a capping substrate. The capping substrate 230 includes a suitable material as known in the art. In the depicted embodiment, the capping substrate 230 includes stand-off features having a bonding layer 232. Lithography processing and/or etching may be used to pattern and define the stand-off features having the bonding layer 232 as illustrated in FIG. 6. In the depicted embodiment, the bonding layer 232 includes silicon, such as amorphous silicon. Alternatively, the bonding layer may include TiSi or other suitable material. The capping substrate 230 and device substrate 218 are bonded by coupling the bonding layer 212 and the bonding layer 232 by a suitable bonding process, such as a compressive bonding process, a thermal diffusion bonding process, or a eutectic bonding process. In an example, the bonding layers 212 and 232 are eutectically bonded. The eutectic bonding process may include metal/metal bonding and/or metal/semiconductor bonding. If the bonding process involves a substrate including CMOS devices, one may control the bonding temperature near or lower than device temperature limitations.

Figure 7A:
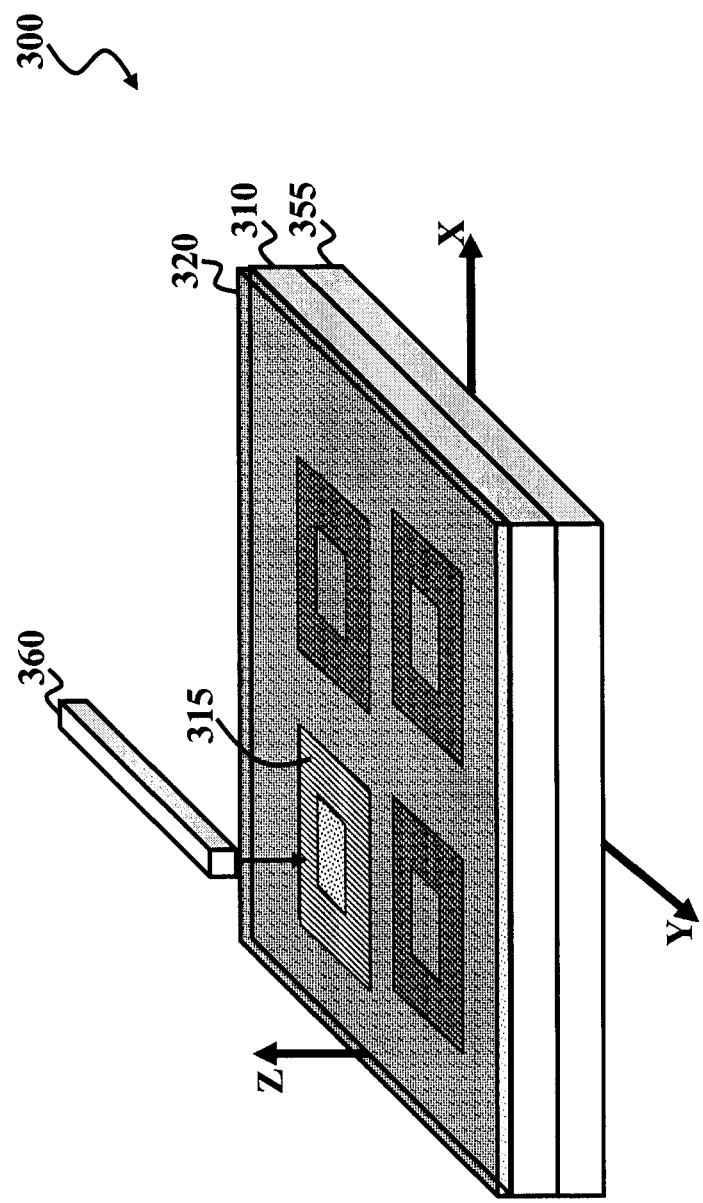
FIGS. 7A and 7B are perspective views of an apparatus used to implement the method of FIG. 1 according to various aspects of the present disclosure.
Figure 7B:
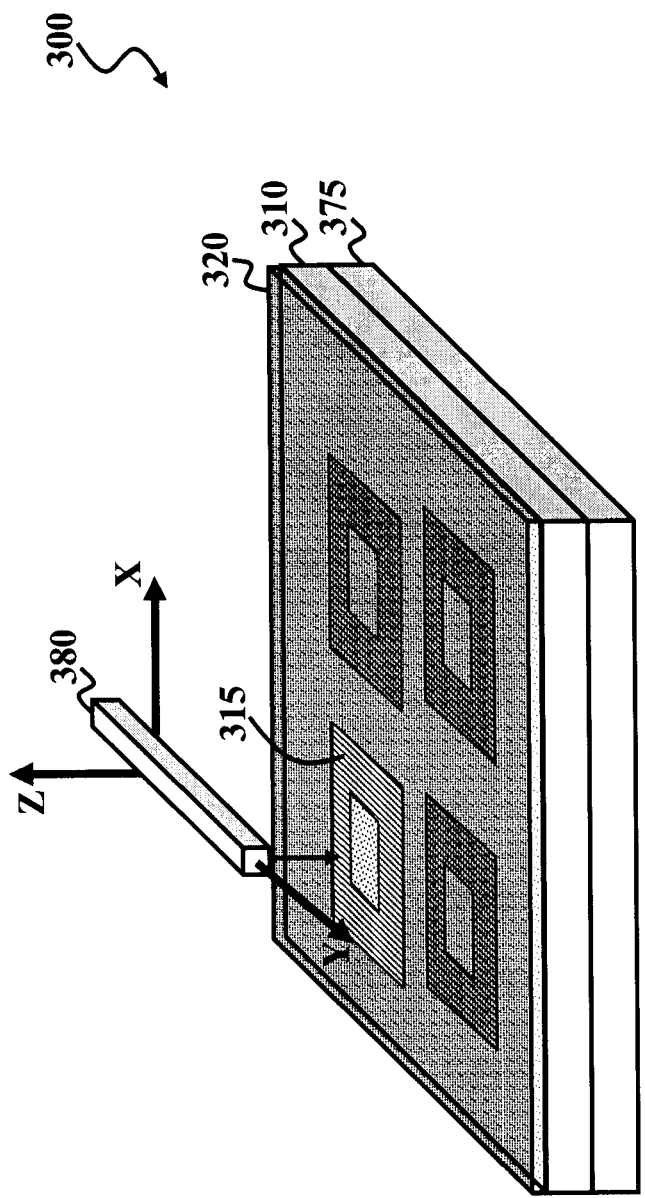

FIGS. 7A and 7B are perspective views of an apparatus 300 used to implement the method of FIG. 1 according to various aspects of the present disclosure. The apparatus 300 uses an excimer laser or a charged particle beam, such as an electron beam, to selectively remove the anti-stiction layer. Using the excimer laser or charged particle beam can eliminate the need for using a mask to remove the anti-stiction layer from some areas of a material layer, such as s substrate, while leaving the anti-stiction layer on other areas of the material layer. FIGS. 7A and 7B have been simplified for the sake of clarity to better understand the inventive concepts of the present disclosure. Additional features can be added in the apparatus 300, and some of the features described below can be replaced or eliminated for additional embodiments of the apparatus 300.

In FIGS. 7A and 7B, a substrate 310 including a metal feature 315 disposed therein, and an anti-stiction layer 320 is disposed over the substrate 310 and metal feature 315. The substrate 310 includes a silicon-based material, and the metal feature 315 includes a metal-based material. Exemplary silicon-based materials include silicon, polysilicon, silicon oxide, silicon nitride, other silicon-based material, or combinations thereof. Exemplary metal-based materials include Al (aluminum), Ge (germanium), Ti (titanium), Cu (copper), W (tungsten), In (indium), Au (gold), Sn (tin), other metal-based material, alloys thereof (such as AlCu, TiN, AlGe, or AuSn), or combinations thereof. The anti-stiction layer 320 is an organic based material. In the depicted embodiment, the anti-stiction layer 320 includes one or more self-assembled monolayers (SAMs). The SAMs layer may include silane molecules and alky-chains, or fluorinated alky-chains. For example, the SAMs layer may include FOST ($C_8H_4Cl_3F_{13}Si$), FOMDS ($C_9H_7Cl_2F_{13}Si$), FOMMS ($C_{10}H_{10}ClF_{13}Si$), FOTES ($C_{14}H_{19}F_{13}O_3Si$), FDTS ($C_{10}H_4F_{19}Cl_3Si$), OTS ($C_{18}H_{37}Cl_3Si$), other suitable material, or combinations thereof.

In FIG. 7A, the anti-stiction layer 320 disposed over the substrate 310 including the metal feature 315 disposed therein are disposed on a moveable wafer stage 355. The moveable wafer stage can be moved in an x direction, a y direction, and/or a z direction. The moveable wafer stage 355 is positioned in the x, y, and/or z directions to allow a radiation source 360 to selectively remove the anti-stiction layer 320 from over the metal feature 315. In the depicted embodiment, the radiation source 360 has a fixed position. The radiation source 360 is an excimer laser or a charged particle beam, such as an electron beam. In contrast, in FIG. 7B, the anti-stiction layer 320 disposed over the substrate 310 including the metal feature 315 disposed therein are disposed on a fixed wafer stage 355, and a moveable radiation source 380 selectively removes the anti-stiction layer 320 from over the metal feature 315. The moveable radiation source 380 can be moved in an x direction, a y direction, and/or a z direction. Similar to the radiation source 360, the moveable radiation source 380 is an excimer laser or a charged particle beam, such as an electron beam.

The present disclosure provides various methods and apparatuses for removing an anti-stiction layer. The disclosed methods and apparatuses can selectively remove the anti-stiction layer from some areas of a substrate (such as bonding areas of a substrate) while preserving the anti-stiction layer on other areas of the substrate (such as non-bonding areas of the substrate, for example, a MEMS device of the substrate), thereby eliminating the need for using a mask to accomplish such removal. Such selective removal can simplify device processing flows and processing costs. Further, the selective anti-stiction removal process is compatible with packaging technology, particularly wafer level packaging technology. Accordingly, the disclosed methods can integrate anti-stiction layer formation and removal, along with device packaging, in one process and/or one process chamber. Different embodiments may have different advantages, and no particular advantage is necessarily required of any embodiment.

The present disclosure provides for may different embodiments. For example, a method includes forming an anti-stiction layer over a substrate, including over a first substrate region of a first material and a second substrate region of a second material, wherein the second material is different than the first material; and selectively removing the anti-stiction layer from the second substrate region of the second material without using a mask. The selective removal may include applying a thermal treatment process to the anti-stiction layer. The thermal treatment process may use a thermal treatment process parameter that removes the anti-stiction layer from the second substrate region of the second material while leaving the anti-stiction layer remaining over the first substrate region of the first material. The thermal treatment process may use a thermal treatment temperature of about 100° C. to about 500° C. The thermal treatment process may use a thermal treatment time of about ten minutes to about three hours. The method may further include bonding another substrate to the second substrate region after selectively removing the anti-stiction layer from the second substrate region of the second material. The method may further include forming the anti-stiction layer and selectively removing the anti-stiction layer in a same processing chamber.

Forming the anti-stiction layer over the substrate may include coating the substrate with a self-assembling monolayer (SAM). The SAM layer may include one of FOST ($C_8H_4Cl_3F_{13}Si$), FOMDS ($C_9H_7Cl_2F_{13}Si$), FOMMS ($C_{10}H_{10}ClF_{13}Si$), FOTES ($C_{14}H_{19}F_{13}O_3Si$), FDTS ($C_{10}H_4F_{19}Cl_3Si$), OTS ($C_{18}H_{37}Cl_3Si$), or a combination thereof. In an example, the first material is a silicon-based material, and the second material is a metal-based material. Forming the anti-stiction layer over the substrate may include forming a first type of chemical bonds between the anti-stiction layer and the first material of the first substrate region; and forming a second type of chemical bonds between the anti-stiction layer and the second material of the second substrate region, wherein the first type of chemical bonds have a greater bonding energy than the second type of chemical bonds.

In another example, a method includes providing a first substrate having a bonding area of a first material and a non-bonding area of a second material; forming an anti-stiction layer over the first substrate, wherein the anti-stiction layer is formed over the bonding area of the first material and the non-bonding area of the second material; selectively removing the anti-stiction layer from the bonding area by performing a thermal treatment process to the anti-stiction layer; and coupling a second substrate to the bonding area of the first substrate. The first substrate may include a microelectromechanical (MEMS) device in the non-bonding area, and the anti-stiction layer may coat the MEMS device. The second substrate may be a capping substrate. Forming the anti-stiction layer over the first substrate may include forming a first bond between the anti-stiction layer and the bonding area of the first material, and forming a second bond between the anti-stiction layer and the non-bonding area of the second material, wherein the second bond is stronger than the first bond. Forming the anti-stiction layer over the first substrate may include forming self-assembling monolayers having silane molecules over the first substrate. Forming the self-assembling monolayers having silane molecules over the first substrate may include forming covalent bonds between the non-bonding area and hydrolyzed silane molecules of the self-assembling monolayers.

In yet another example, a method includes forming a material layer of a first material over a substrate that includes a second material in a first region and a third material in a second region; and thermally treating the material layer of the first material, such that the material layer of the first material is removed from the third material in the second region. Forming the material layer of the first material layer over the substrate may include forming Si—Si bonds between the material layer of the first material and the second material in the first region and forming Si-metal bonds between the material layer of the first material and the third material in the second region. Thermally treating the material layer of the first material may include thermally treating the material layer of the first material with a thermal treatment temperature that substantially breaks down the Si-metal bonds between the material layer of the first material and the third material in the second region. Thermally treating the material layer of the first material with the thermal treatment temperature may include preserving the Si—Si bonds between the material layer of the first material and the second material in the first region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming an anti-stiction layer over a substrate, including over a first substrate region of a first material and a second substrate region of a second material, wherein the second material is different than the first material; and
    selectively removing the anti-stiction layer from the second substrate region of the second material without using a mask,
    wherein the selectively removing of the anti-stiction layer includes applying a thermal treatment process to a first portion of the anti-stiction layer formed over the first region and a second portion of the anti-stiction layer formed over the second region, and
    wherein the thermal treatment process breaks down bonds between the second portion and the second material faster than the process breaks down bonds between the first portion and the first material.

2. The method of claim 1 wherein the applying the thermal treatment process to the anti-stiction layer includes using a thermal treatment temperature of about 100° C. to about 500° C.

3. The method of claim 1 wherein the applying the thermal treatment process to the anti-stiction layer includes using a thermal treatment time of about ten minutes to about three hours.

4. The method of claim 1 wherein the forming the anti-stiction layer over the substrate includes coating the substrate with a self-assembling monolayer (SAM).

5. The method of claim 4 wherein the coating the substrate with a SAM layer includes coating the substrate with a SAMs layer that includes one of FOST ($C_8H_4Cl_3F_{13}Si$), FOMDS ($C_9H_7Cl_2F_{13}Si$), FOMMS ($C_{10}H_{10}ClF_{13}Si$), FOTES ($C_{14}H_{19}F_{13}O_3Si$), FDTS ($C_{10}H_4F_{19}Cl_3Si$), OTS ($C_{18}H_{37}Cl_3Si$), or a combination thereof.

6. The method of claim 1 wherein:
    the first material is a silicon-based material; and
    the second material is a metal-based material.

7. The method of claim 1 wherein the forming the anti-stiction layer over the substrate includes:
    forming a first type of chemical bonds between the anti-stiction layer and the first material of the first substrate region; and
    forming a second type of chemical bonds between the anti-stiction layer and the second material of the second substrate region, wherein the first type of chemical bonds have a greater bonding energy than the second type of chemical bonds.

8. The method of claim 1 further including bonding another substrate to the second substrate region after selectively removing the anti-stiction layer from the second substrate region of the second material.

9. The method of claim 1 further including forming the anti-stiction layer and selectively removing the anti-stiction layer in a same processing chamber.

10. A method comprising:
    providing a first substrate having a bonding area of a first material and a non-bonding area of a second material;
    forming an anti-stiction layer over the first substrate, wherein a first portion of the anti-stiction layer is formed over the bonding area of the first material and a second portion of the anti-stiction layer is formed over the non-bonding area of the second material;

selectively removing the anti-stiction layer from the bonding area without using a mask by performing a thermal treatment process to the first and second portions of the anti-stiction layer; and coupling a second substrate to the bonding area of the first substrate, wherein the thermal treatment process breaks down bonds between the first portion and the first material faster than the process breaks down bonds between the second portion and the second material.

11. The method of claim 10 wherein:

the providing the first substrate includes providing the first substrate including a microelectromechanical (MEMS) device in the non-bonding area; and the forming the anti-stiction layer over the first substrate includes coating the MEMS device with the anti-stiction layer.

12. The method of claim 11 wherein the bonding the second substrate to the bonding area of the first substrate includes bonding a capping substrate to the first substrate.

13. The method of claim 10 wherein the forming the anti-stiction layer over the first substrate includes:

forming a first bond between the first portion of the anti-stiction layer and the bonding area of the first material; and forming a second bond between the second portion of the anti-stiction layer and the non-bonding area of the second material, wherein the second bond is stronger than the first bond.

14. The method of claim 10 wherein the forming the anti-stiction layer over the first substrate includes forming self-assembling monolayers having silane molecules over the first substrate.

15. The method of claim 14 wherein the forming the self-assembling monolayers having silane molecules over the first substrate includes forming covalent bonds between the non-bonding area and hydrolyzed silane molecules of the self-assembling monolayers.

16. A method comprising:

forming a material layer over a substrate having a first region and a second region; and thermally treating the material layer without masking to remove a first portion of the material layer over the first region while leaving a second portion of the material layer over the second region, wherein the thermally treating of the material layer breaks down bonds between the first portion and the first region faster than the process breaks down bonds between the second portion and the second region.

17. The method of claim 16 wherein the forming the material layer over the substrate having the first region and the second region includes:

forming Si—Si bonds between the material layer and the second region of the substrate; and forming Si-metal bonds between the material layer and the first region of the substrate.

18. The method of claim 1 wherein the thermal treatment process converts the second portion of the anti-stiction layer into a gas state.

19. The method of claim 1, wherein after selectively removing the anti-stiction layer from the second substrate region of the second material without using the mask, the second substrate region is free of the anti-stiction layer.

20. The method of claim 10, wherein the first material includes a metal and the second material includes silicon.

21. The method of claim 16, wherein thermally treating the material layer further includes thermally treating at a temperature of about 100° C. to about 500° C. for a time of about ten minutes to about three hours.

* * * * *